(12) United States Patent
Hodge et al.

(10) Patent No.: US 8,853,043 B2
(45) Date of Patent: Oct. 7, 2014

(54) SILICON GERMANIUM (SIGE) HETEROJUNCTION BIPOLAR TRANSISTOR (HBT)

(75) Inventors: Wade J. Hodge, Bolton, VT (US); Alvin J. Joseph, Williston, VT (US); Rajendran Krishnasamy, Essex Junction, VT (US); Qizhi Liu, Essex Junction, VT (US); Bradley A. Orner, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/610,641

(22) Filed: Sep. 11, 2012

(65) Prior Publication Data

US 2013/0005108 A1    Jan. 3, 2013

Related U.S. Application Data

(62) Division of application No. 11/161,936, filed on Aug. 23, 2005, now Pat. No. 8,299,500.

(51) Int. Cl.
| | |
|---|---|
| *H01L 21/331* | (2006.01) |
| *H01L 21/8222* | (2006.01) |
| *H01L 29/737* | (2006.01) |
| *H01L 29/10* | (2006.01) |
| *H01L 21/8249* | (2006.01) |

(52) U.S. Cl.
CPC ........ *H01L 29/7378* (2013.01); *H01L 29/1004* (2013.01); *H01L 21/8249* (2013.01)
USPC ............... 438/312; 257/12; 257/19; 257/183; 257/187; 257/197; 257/205; 257/511; 257/525; 257/556; 257/557; 257/E29.033; 257/E21.371; 257/E21.608; 257/E27.055; 438/235; 438/236

(58) Field of Classification Search
CPC .................... H01L 29/66242; H01L 29/7378; H01L 29/66287
USPC ............... 257/12, 19, 20, 183, 187, 197, 200, 257/205, 511, 525, 526, 556, 557, E29.033, 257/E21.371, E21.372, E21.608, E27.055; 438/235, 236, 313
See application file for complete search history.

(56) References Cited

U.S. PATENT DOCUMENTS

| | | |
|---|---|---|
| 6,316,795 B1 | 11/2001 | Croke, III |
| 6,437,406 B1 | 8/2002 | Lee |
| 6,465,317 B2 | 10/2002 | Marty |
| 6,642,096 B2 | 11/2003 | Dutartre et al. |
| 6,670,654 B2 | 12/2003 | Lanzerotti et al. |
| 6,767,798 B2 | 7/2004 | Kalnitsky et al. |

(Continued)

FOREIGN PATENT DOCUMENTS

EP    1282172    2/2003

OTHER PUBLICATIONS

Manne et al., "Pipeline Gating: Speculation Control for Energy Reduction", "Proc. 25th Int'l Symp. on Computer Architecture (ISCA)", 1998.

(Continued)

*Primary Examiner* — Meiya Li
(74) *Attorney, Agent, or Firm* — Law Office of Charles W. Peterson, Jr.; Anthony Canale

(57) ABSTRACT

A heterojunction bipolar transistor (HBT), an integrated circuit (IC) chip including at least one HBT and a method of forming the IC. The HBT includes an extrinsic base with one or more buried interstitial barrier layer. The extrinsic base may be heavily doped with boron and each buried interstitial barrier layer is doped with a dopant containing carbon, e.g., carbon or SiGe:C. The surface of the extrinsic base may be silicided.

19 Claims, 2 Drawing Sheets

(56) References Cited

U.S. PATENT DOCUMENTS 6,906,401 B2 6/2005 Dunn et al.
2004/0192002 A1 9/2004 Soman et al.

OTHER PUBLICATIONS

Stolk, P.A. et al, "Carbon Incorporation in Silicon for Suppressing Interstitial-enhanced Boron Diffusion", Mar. 13, 1995, Publisher: Applied Physics Letters.

Lanzerotti, et al., "Suppression of Boron Outdiffusion in SiGe HBTs by Carbon Incoporation", "IEDM Technical Digest", Dec. 8, 1996.

Ghani, T et al, "Control of Implant-damage-enhanced boron Diffusion in Epitaxially Grown n-Si/p-Sil xGex/n-Si Heterojuntion Bipolar Tran", "J. of Electronic Materials", Aug. 1, 1995.

Kwok K. Ng, "Complete Guide to Semiconductor Devices", Jan. 1, 2002, pp. 32 and 628, Publisher: Wiley-Interscience.

ated ions
SILICON GERMANIUM (SIGE) HETEROJUNCTION BIPOLAR TRANSISTOR (HBT)

CROSS REFERENCE TO RELATED APPLICATIONS

The present application is a Divisional application of allowed U.S. patent application Ser. No. 11/161,936, "SILICON GERMANIUM (SiGe) HETEROJUNCTION BIPOLAR TRANSISTOR (HBT)" to Wade J. Hodge et al., filed Aug. 23, 2005, assigned to the assignee of the present invention and incorporated herein by reference.

BACKGROUND OF THE INVENTION

1. Field of the Invention

The present invention is related to a silicon germanium (SiGe) heterojunction bipolar transistor (HBT) and more particularly to improving SiGe HBT circuit performance.

2. Background Description

A typical bipolar transistor is a vertical stack of layers semiconductor material of alternating conduction type, i.e., NPN or PNP. Normally, the collector is located at the bottom of the stack with the base is sandwiched between the collector and the emitter. Forward biasing the base to emitter junction cases current to flow through that junction. Current through the base to emitter junction cases a much larger current to flow between the collector and emitter. Typically, each transistor terminal (base, emitter and collector) exhibits some inherent internal resistance. Current through an internal collector resistance, base resistance, or emitter resistance reduces the effective voltage to the respective transistor terminal. So, current flowing through any internal transistor resistance develops some voltage that reduces drive and impairs transistor performance. Consequently, internal transistor resistance is a primary limitation on performance for state of the art bipolar circuits.

Silicon Germanium (SiGe) heterojunction bipolar transistors (HBTs) have found widespread use in high speed applications and, especially in Radio Frequency (RF) applications, high speed wired data transmission, test equipment, and wireless applications. Extrinsic Base (ExB) resistance ($R_b$) has been a primary limitation of transistor performance with HBTs in particular. One way to reduce $R_b$ is to increase the extrinsic base dopant concentration, i.e., implanting a suitable dopant into the extrinsic base to drive the resistance down. For example, the extrinsic base may be implanted with a high concentration boron (B) for a typical NPN HBT. Implanting the extrinsic base also can improve the link between a polycrystalline extrinsic base and a monocrystalline intrinsic base (IB), that is doped with a lower concentration of the same type dopant.

Unfortunately, implanting dopant introduces defects to significantly increase the number of defects in the implanted material with the increase proportional to implant dose, energy, mass and etc. Also, activating the implanted ions (boron) to diffuse them into the extrinsic base, induces interstitials in the extrinsic base to migrate/diffuse into the intrinsic base, which may widen the base. Furthermore, the interstitials also may migrate from the base into active transistor regions, i.e., into the sub-collector, causing sub-collector dopant (e.g., Phosphorous, arsenic, antimony or a combination thereof) to diffuse laterally, increasing internal sub-collector resistance. This interstitial migration reduces HBT gain to further degrade device performance, both static and dynamic (AC/D) performance, dissipating any improvement that might have resulted from reducing $R_b$.

Thus, there is a need for reducing extrinsic base resistance in high frequency SiGe HBTs without impairing transistor performance.

SUMMARY OF THE INVENTION

It is a purpose of the invention to improve Silicon Germanium (SiGe) heterojunction bipolar transistor (HBT) circuit performance;

It is another purpose of the invention to reduce extrinsic base resistance in SiGe HBTs;

It is yet another purpose of the invention to reduce extrinsic base resistance in SiGe HBTs without widening the base or incurring interstitial migration into the intrinsic base;

It is yet another purpose of the invention to reduce extrinsic base resistance in SiGe HBTs without widening the collector or incurring interstitial migration into the collector;

It is yet another purpose of the invention to improve SiGe HBT circuit performance, while reducing extrinsic base resistance in circuit SiGe HBTs and without widening the base or collector and without increasing interstitial migration into the base or collector.

The present invention relates to a heterojunction bipolar transistor (HBT), an integrated circuit (IC) chip including at least one HBT and a method of forming the IC. The HBT includes an extrinsic base with one or more buried interstitial barrier layer. The extrinsic base may be heavily doped with boron and each buried interstitial barrier layer is doped with a dopant containing carbon, e.g., carbon or SiGe:C. The surface of the extrinsic base may be silicided.

BRIEF DESCRIPTION OF THE DRAWINGS

The foregoing and other objects, aspects and advantages will be better understood from the following detailed description of a preferred embodiment of the invention with reference to the drawings, in which.

DESCRIPTION OF PREFERRED EMBODIMENTS

Figure 1:
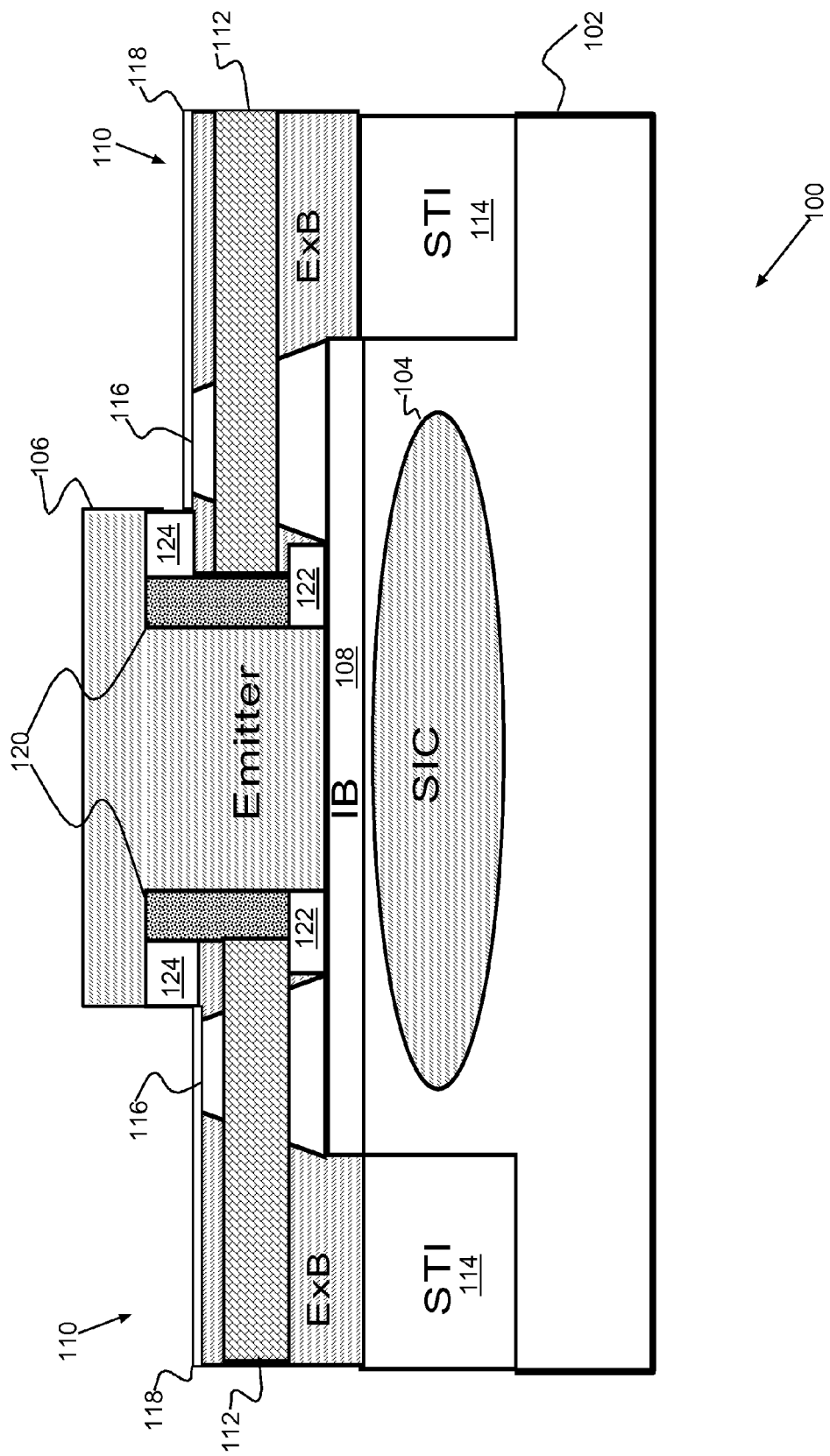
FIG. 1 shows an example of a Silicon Germanium (SiGe) heterojunction bipolar transistor (HBT) with reduced Extrinsic Base (ExB) resistance ($R_b$) according a preferred embodiment to the present invention.

Turning now to the drawings and, more particularly, FIG. 1 shows an example of a Silicon Germanium (SiGe) heterojunction bipolar transistor (HBT) 100 with reduced Extrinsic Base (ExB) resistance ($R_b$) according a preferred embodiment to the present invention. The SiGe HBT (hereinafter HBT) 100 may be one of a number of such HBTs connected to other devices including other HBTs in a typical Integrated Circuit (IC), e.g., on a BiCMOS IC chip. Each HBT 100 is formed in a surface of a semiconductor layer 102, e.g., a silicon substrate, and includes a collector/sub-collector (SiC) 104, an emitter 106 and a base sandwiched between the sub-collector 104 and emitter 106. The base includes an intrinsic base 108 and an extrinsic base 110 with an interstitial barrier 112, in this example a layer 112 containing carbon or SiGe:C, e.g., doped with C or SiGe:C to a concentration between $1*10^{20}$ and $5*10^{20}/cm^3$, during low-temperature (400-750 C°) epitaxial growth, and preferably, between $1*10^{20}$ and $2*10^{20}/cm^3$ at 400-650 C°. The interstitial barrier 112 prevents or dramatically reduces interstitial migration from extrinsic base 110 into the intrinsic base 108 and sub-collector 104. Thus, with the interstitial barrier 112 trapping interstitials in the extrinsic base 110, the extrinsic base 110 may be doped to the solid solubility limit of the selected dopant. So, for example, the SiGe extrinsic base 110 may be doped with Boron (B) to the solid solubility limit of dopant without concern for interstitial migration.

Accordingly, the extrinsic base 110 is heavily implanted with boron (e.g., with a boron concentration between $1*10^{14}$ and $5*10^{15}/cm^3$ at an energy of 8-20 keV, and preferably between $1*10^{14}$ and $3*10^{15}/cm^3$ at an energy of 8-15 keV) and the implanted boron is activated, e.g., with a high temperature anneal, to reduce $R_b$ according to a preferred embodiment of the present invention. The HBT collector is defined in the upper surface of the semiconductor layer 102 by trenches 114 filled with dielectric material, e.g., shallow trenches 114 formed using typical Shallow Trench Isolation (STI) techniques. Typically, after filling the trenches 114 with dielectric material, the wafer surface is planarized using a chemical-mechanical (chem-mech) polish. The base is formed on the planarized surface as a SiGe layer of uniform thickness with extrinsic base 110 forming as polycrystalline SiGe on trenches 114 and intrinsic base 108 forming as monocrystalline SiGe on the semiconductor sub-collector 104. The polycrystalline extrinsic base 110 links through a facet region 116 to the monocrystalline intrinsic base 108. Preferably, silicide is formed on the surface 118 of the extrinsic base 110 to further reduce $R_b$. The interstitial barrier 112 of this example may be formed by in situ doping the SiGe layer with carbon as the SiGe layer is grown or by a carbon implant after base layer formation is complete. A nitride spacer or collar 120 on landing pads 122 separates and isolates the emitter 106 from the extrinsic base 110. Preferably the emitter 106 is formed by removing the upper portion of the base layer to the thickness selected for the intrinsic base 108. See, e.g., U.S. Pat. No. 6,906,401 B2 to Dunn et al., entitled "Method to Fabricate High Performance NPN Transistors in a BiCMOS Process" assigned to the assignee of the present invention and incorporated herein by reference. Dielectric spacers 124 maintain separation between the emitter 106 and the facet regions 116.

In addition to enabling heavily doping the extrinsic base with boron and further, activating the implanted boron to reduce $R_b$, the interstitial barrier 112 traps interstitials in the extrinsic base 110 to control the lateral diffusion of the n-type boron dopant of the present example into the p-type sub-collector 104. Also, the interstitial barrier 112 minimizes diffusion of sub-collector dopant (Phosphorus), to contain expansion of sub-collector 104 to intrinsic base 108 junction width and, correspondingly, minimize any increase in collector to base capacitance ($C_{cb}$). Also, the interstitial barrier 112 reduces the effects of the boron on the intrinsic base 108, i.e., limits widening the intrinsic base 108 which would otherwise reduce the unity current gain frequency (Ft) for the HBT. Further, since the unity unilateral power gain frequency, $F_{max}=(Ft/(8\pi R_b C_{cb}))^{1/2}$; $F_{max}$ is increased for a preferred HBT because Ft is maintained, while both $R_b$ and $C_{cb}$ are contained or reduced.

Figure 2:
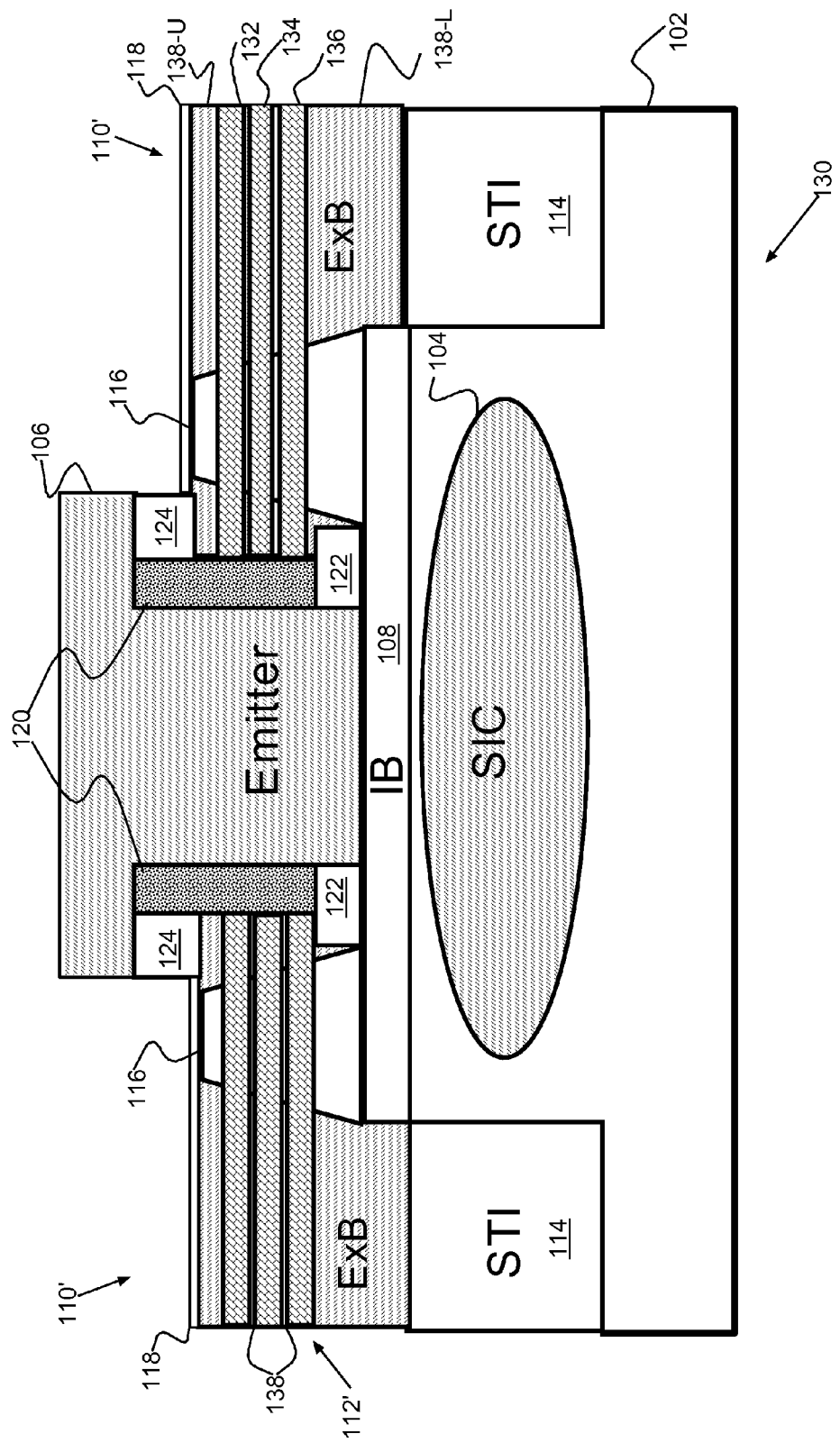
FIG. 2 shows another example of a preferred embodiment HBT.

FIG. 2 shows another example of a preferred embodiment HBT 130 with like elements labeled identically. In this example, the interstitial barrier 112' is a layered structure with multiple barrier layers 132, 134, 136 containing carbon buried in the SiGe extrinsic base 110'. Each of the multiple layers 132, 134, 136 may be ion implanted as described for the single layer 112. Alternately, the first SiGe base layer 138-L can be grown to a given thickness (e.g., 100-350 Å, and preferably, 100-250 Å) followed by a thin in situ doped (with boron) SiGe base layer 138, and repeating for the remaining layers 134, 136. Each of the multiple layers 132, 134, 136 may be formed by step doping with carbon or with SiGe:C, e.g., at a concentration between $1*10^{20}$ and $5*10^{20}/cm^3$, and during low-temperature (400-750 C°) epitaxial growth, and preferably, between $1*10^{20}$ and $2*10^{20}/cm^3$ at 400-650 C°. Finally, in situ doped-poly silicon or SiGe layer 138-U is grown on the multi-layered interstitial barrier 112', primarily, to facilitate silicidation. Typically, carbon or a SiGe:C layer is not suited to silicidation. This is because the agglomeration of materials that forms during barrier formation can rapidly increase the resulting base resistance to spoil the benefits of the interstitial barrier. However, this preferred embodiment HBT 130 overcomes this handicap because the contact surface layer, e.g., 134, is grown above the C or SiGe:C in the buried interstitial barrier.

In this example, although carbon diffuses faster than any other dopants, by alternating and sandwiching the interstitial barrier layers 132, 134, 136 between un-doped (with carbon or SiGe:C) extrinsic base layers, the carbon in the interstitial barrier layers 132, 134, 136 trap interstitials, which diffuse faster than carbon. So, for this multi-layer embodiment, any interstitials not trapped by upper interstitial barrier layer 136, can be easily trapped by the middle interstitial barrier layer 134, and any that escape the middle 134 are trapped by the bottom 132.

Thus, advantageously, because the interstitial barrier 112, 112' traps interstitials, $R_b$ may be reduced with a high doping concentration of boron in the extrinsic base 110. Since any carbon in the extrinsic base 110, 110' is buried in the interstitial barrier 112, 112', the extrinsic base resistance may be further reduced by silicide. Additionally, the interstitial barrier 112, 112' prevents interstitials from diffusing in the extrinsic base 110, 110' towards the intrinsic base 108 and into the sub-collector 104. This also prevents lateral diffusion of the phosphorous in the sub-collector 104 to minimize widening the collector and realize a performance gain in a preferred embodiment HBT 100. Any such performance gain was previously partially or completely negated by interstitial migration that occurred in diffusing the boron. Further, by choosing the right carbon or SiGe:C dose/energy (or concentrations), barrier layers form such that interstitials are trapped at the interface between intrinsic base 108 and extrinsic base 110. Thus, the higher dopant concentration provides an improved link between the intrinsic base 108 and the extrinsic base 110, that reduces the resistance that the link contributes to $R_b$. This reduction is in addition to the reduction realized from the dopant activation of the implanted boron in the extrinsic base 110. So, both $R_b$ and $C_{cb}$ are reduced to maintain Ft and, correspondingly, to increase $F_{max}$.

While the invention has been described in terms of preferred embodiments, those skilled in the art will recognize that the invention can be practiced with modification within the spirit and scope of the appended claims. It is intended that all such variations and modifications fall within the scope of the appended claims. Examples and drawings are, accordingly, to be regarded as illustrative rather than restrictive.

What is claimed is:

1. A method of forming heterojunction bipolar transistors (HBT) on an Integrated Circuit (IC), said method comprising:
   defining a collector in a semiconductor surface;
   forming a base layer on said semiconductor surface;
   forming an interstitial barrier in said base layer;
   forming an emitter above said collector; and
   doping an extrinsic base portion of said base layer with a selected type dopant.

2. The method as in claim 1, wherein forming the base layer and forming said interstitial barrier are repeated to form a plurality of alternating layers of interstitial barrier layers and base material layers, said interstitial barrier layers being step doped with a material comprising carbon.

3. The method as in claim 1, wherein forming said interstitial barrier comprises implanting at least one layer of said base layer with a material comprising carbon.

4. The method as in claim 1, further comprising:
forming a silicide layer on said extrinsic base portion.

5. The method as in claim 1, wherein forming said interstitial barrier forms an uppermost surface and a lowermost surface of said interstitial barrier in said base layer, both directly contacting base layer material in said base layer.

6. The method as in claim 1, wherein forming the emitter comprises forming said emitter on a thinned area of said base layer.

7. The method as in claim 1, wherein forming said base layer comprises forming a Silicon-Germanium (SiGe) layer on said semiconductor surface, said SiGe layer forming a monocrystalline intrinsic base on said collector and polycrystalline said extrinsic base portions on either side of said collector, said interstitial barrier being formed in said extrinsic base regions.

8. The method as in claim 7, wherein doping said extrinsic base portion is coincident with forming said base layer, said extrinsic base portions being in situ doped with boron to a solid solubility limit of boron in said SiGe layer.

9. A method of forming heterojunction bipolar transistors (HBT) on an Integrated Circuit (IC), said method comprising:
defining a collector in a semiconductor surface;
forming a base layer on said semiconductor surface, said base layer comprising a monocrystalline intrinsic base on said collector and polycrystalline extrinsic base portions on either side of said collector;
forming an interstitial barrier in said polycrystalline extrinsic base regions;
forming an emitter above said collector; and
doping said extrinsic base portions with a selected type dopant.

10. The method as in claim 9, wherein forming said interstitial barrier forms at least one interstitial barrier layer, both an uppermost layer surface and a lowermost layer surface of said interstitial barrier directly contacting base layer material in said extrinsic base portions.

11. The method as in claim 10, wherein forming said base layer comprises:
forming a Silicon-Germanium (SiGe) layer on said semiconductor surface; and
forming said emitter on a thinned monocrystalline intrinsic base region of said SiGe layer.

12. The method as in claim 11, wherein forming the base layer and forming said interstitial barrier are repeated to form a plurality of alternating layers of interstitial barrier layers and base material layers, said interstitial barrier layers being step doped with a material comprising carbon.

13. The method as in claim 11, wherein forming said interstitial barrier comprises implanting at least one layer of a material comprising carbon into said base layer.

14. The method as in claim 11, wherein doping said polycrystalline extrinsic base portion is coincident with forming said base layer, said polycrystalline extrinsic base portions being in situ doped with boron to a solid solubility limit of boron in said SiGe layer.

15. The method as in claim 11, further comprising:
forming a silicide layer on said extrinsic base portions.

16. A method of forming heterojunction bipolar transistors (HBT) on an Integrated Circuit (IC), said method comprising:
defining a collector in a semiconductor surface;
forming a base layer on said semiconductor surface, said base layer comprising a Silicon-Germanium (SiGe) layer, a monocrystalline intrinsic base forming on said collector and polycrystalline extrinsic base portions forming on either side of said collector;
forming an interstitial barrier in said extrinsic base regions, wherein forming said interstitial barrier forms at least one layer with both an uppermost layer surface and a lowermost layer surface of said interstitial barrier directly contacting polycrystalline extrinsic base layer SiGe;
forming an emitter on the monocrystalline intrinsic base above said collector;
doping said extrinsic base portions of said base layer with a selected type dopant; and
forming a silicide layer on said extrinsic base portion.

17. The method as in claim 16, wherein forming the base layer and forming said interstitial barrier are repeated to form a plurality of alternating layers of interstitial barrier layers and base material layers, said interstitial barrier layers being step doped with a material comprising carbon.

18. The method as in claim 16, wherein forming said interstitial barrier comprises implanting said base layer with at least one layer of a material comprising carbon.

19. The method as in claim 16, wherein doping said extrinsic base portions is coincident with forming said base layer, said extrinsic base regions being in situ doped with boron to a solid solubility limit of boron in said SiGe layer.

* * * * *